United States Patent [19]

Harms, deceased et al.

[11] Patent Number: 4,790,762

[45] Date of Patent: Dec. 13, 1988

[54] BACKPLANE FOR A MODULARLY EXPANDABLE PROGRAMMABLE CONTROLLER

[75] Inventors: David S. Harms, deceased, late of Freeport, Ill.; Clarence Harms, heir; Joan Harms, heir, both of Brillion, Wis.; Thomas A. Fletcher, Freeport; Richard L. Rowe, Warren, both of Ill.

[73] Assignee: Honeywell Inc., Minneapolis, Minn.

[21] Appl. No.: 83,013

[22] Filed: Aug. 4, 1987

Related U.S. Application Data

[63] Continuation of Ser. No. 758,192, Jul. 23, 1985, abandoned.

[51] Int. Cl.⁴ .............................................. H05K 1/00
[52] U.S. Cl. ...................................... 439/59; 439/62; 439/65; 439/631
[58] Field of Search ............................ 439/55, 59–62, 439/65, 66, 74, 76, 77, 629–637, 723, 724, 727; 361/393, 394, 395, 426–429, 407, 413, 414, 415, 400

[56] References Cited

U.S. PATENT DOCUMENTS

| | | | |
|---|---|---|---|
| 4,037,910 | 7/1977 | Paluch | 339/198 R |
| 4,135,226 | 1/1979 | Kourimsky | 339/17 LM |
| 4,230,986 | 10/1980 | Deaver et al. | 339/17 M |
| 4,331,839 | 5/1982 | Baumbach | 339/17 LM |
| 4,355,853 | 10/1982 | Kourimsky | 339/17 M |
| 4,401,351 | 8/1983 | Record | 339/17 M |
| 4,516,189 | 5/1985 | Seaks, Jr. | 339/198 H |
| 4,538,868 | 9/1985 | Cruise et al. | 339/198 R |

Primary Examiner—David Pirlot
Attorney, Agent, or Firm—Charles L. Rubow

[57] ABSTRACT

A modular programmable controller having an expansible backplane formed of a plurality of structually and electrically connectable backplane units, each comprising a housing having at least a pair of side walls, corresponding edges of which define a seating surface against which an input/output module may be secured. Between the side walls are located field wiring and control bus connectors which allow plug in and removal of a module without disturbing the field wiring or control bus. The control bus segment in a backplane unit comprises an edge card receiving connector in one side wall connected to a card with conductors protruding from the other side wall, the card also being connected to a control bus connector for the module.

12 Claims, 2 Drawing Sheets

BACKPLANE FOR A MODULARLY EXPANDABLE PROGRAMMABLE CONTROLLER

This application is a continuation of application Ser. No. 758,192, filed July 23, 1985, now abandoned.

BACKGROUND OF THE INVENTION

This invention relates to the mechanical construction and electrical interconnection of a modularly expandable programmable controller, and more particularly to an improved backplane unit for a programmable controller module.

Sensing devices are essential to factory automation, but the job of connecting them to prior art programmable controllers or host computers can be time-consuming and costly. There have been proposals in the prior art for modularly expandable controllers. However, these prior art structures do not accommodate readily the input/output wiring and are not as mechanically rugged as is advantageous for many applications.

SUMMARY OF THE INVENTION

The objects of this invention include provision of a backplane which accommodates input/output field wiring and which allows for input/output module removal without disturbing the field wiring.

Another object is the provision of a rugged backplane which positively seats the input/output modules and protects the contact elements of electrical connections between the modules and backplane units.

Briefly this invention contemplates the provision of a backplane in which guide-pins on the backplane housing locate a module as it moves toward a seating surface on the backplane against which the module is secured. Beneath the seating surface there are a plurality of input/output terminals and an edge connector adapted to receive contacts protruding from the module.

For a more complete understanding of the invention, reference is hereby made to the drawings, in which:

DESCRIPTION OF THE INVENTION

Figure 1:
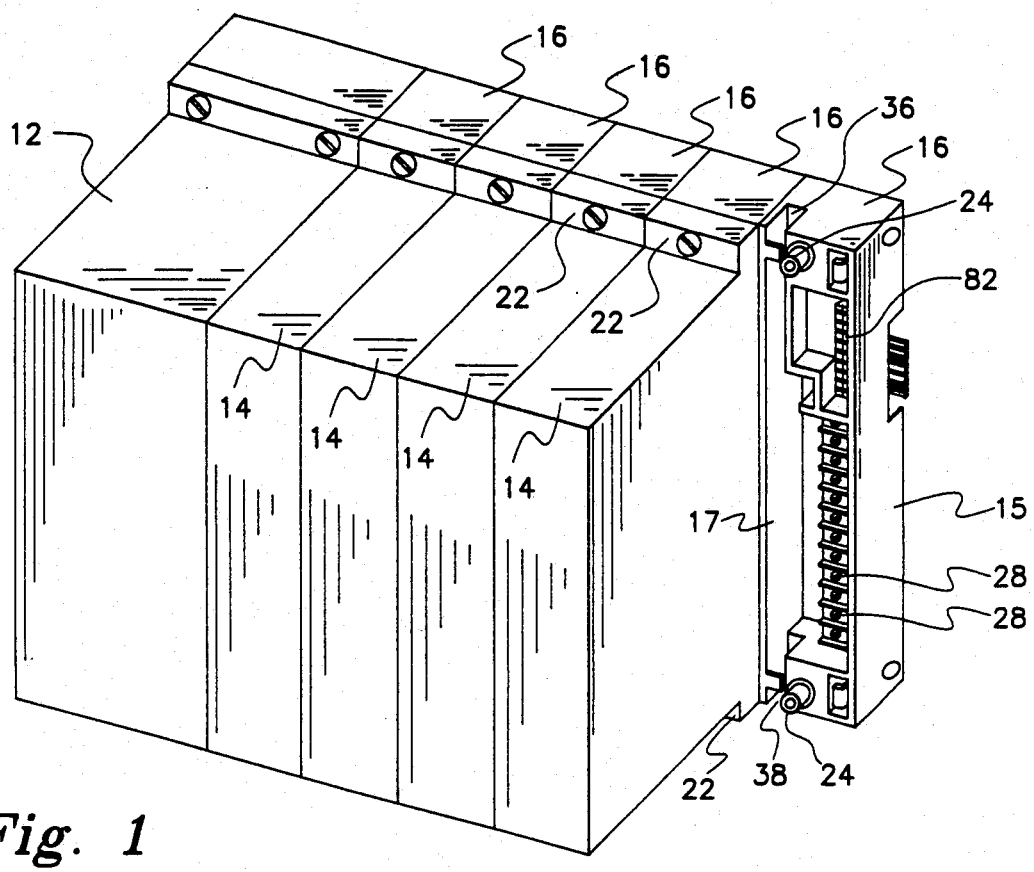
FIG. 1 is a perspective view of a modulus programmable controller with one input/output module removed to reveal a backplane constructed in accordance with the teachings of this invention.

Referring now to the Figures, a programmable controller comprises a central processor 12 and a number of input/output modules 14. There is a backplane unit 16 for each of the modules 14. The backplane made up of units 16 mechanically supports and provides an electrical connection between the modules 14 and the processor 12, and between the modules 14 and field wiring.

In a preferred embodiment of the invention, each backplane unit 16 is a unitary housing molded from a suitable thermoplastic material. The housing has two side walls 15 and 17, the top edges of which form, in part, a seating surface against which a module rests when it is secured to the backplane.

Mounting guides 24 fit into holes in lips 22 on each module 14 and guide the module as it moves towards the backplane. When the module is seated against the seating surface, which advantageously includes regions 27 around the guides 24, screw secure the module to the backplane.

Figure 6:
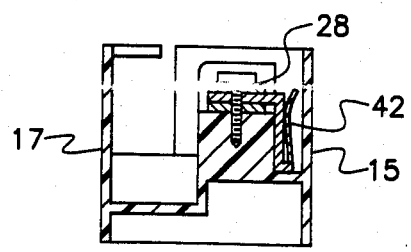
FIG. 6 is a sectional view along the lines 6—6 FIG. 2.

Field wiring terminals 28 are mounted on each backplane unit housing, with the tops of the terminals disposed below the seating surface. Field input/output wiring passes through openings 36 or 38 at the top or bottom of the housing and feeds through a trough formed between the wall of the housing and the terminals 28. Resilient fingers 42 (as shown in FIG. 6) formed integrally with terminals 28 receive contacts (not shown) extending from a module 10 when the module is against the seating surface.

Figure 2:
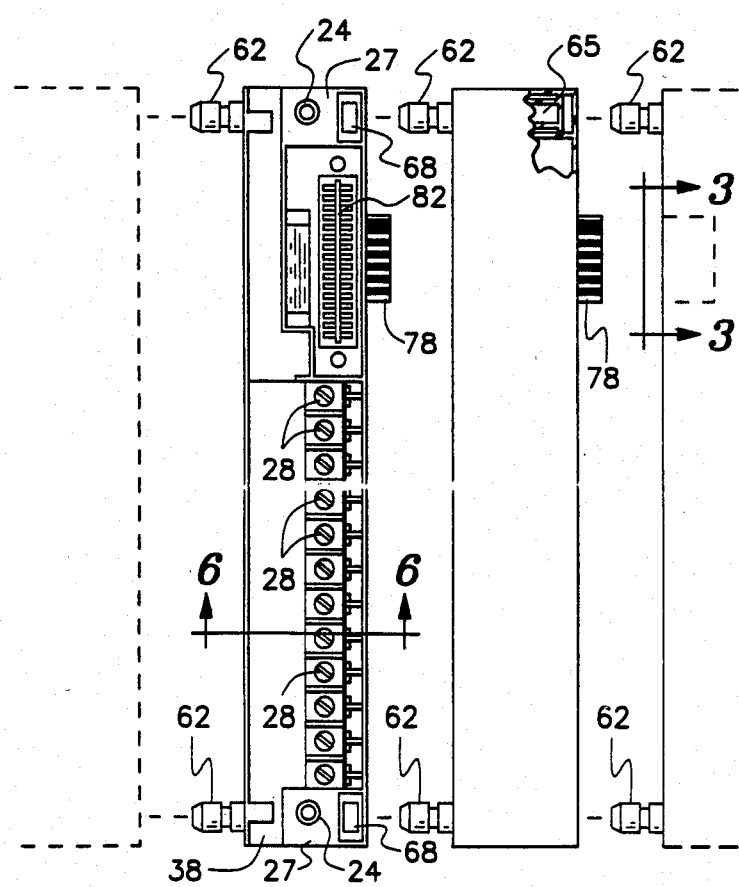
FIG. 2 is a front elevation of several backplane units, showing details of construction and interconnection to adjacent backplane units.
Figure 3:
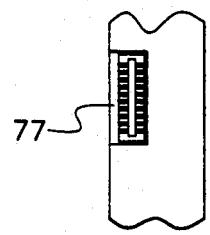
FIG. 3 is a partial sectional view taken along the lines 3—3 in FIG. 2.

As shown most clearly in FIG. 2, each backplane unit 16 can be joined mechanically and electrically to an adjacent backplane unit so that the programmable controller can be modularly expanded by adding input/output modules 14. A pair of pins 62 join the backplane together. These pins are fixed to one side of each backplane unit housing and extend therefrom at right angles to the guides 24. The pins fit snugly in tubes 65 accessible through an opening in the other side of an adjacent housing. A pair of collars 68 moveable into and out of the plane of the drawing in FIG. 2 engage the pins and lock adjacent units together.

Figure 4:
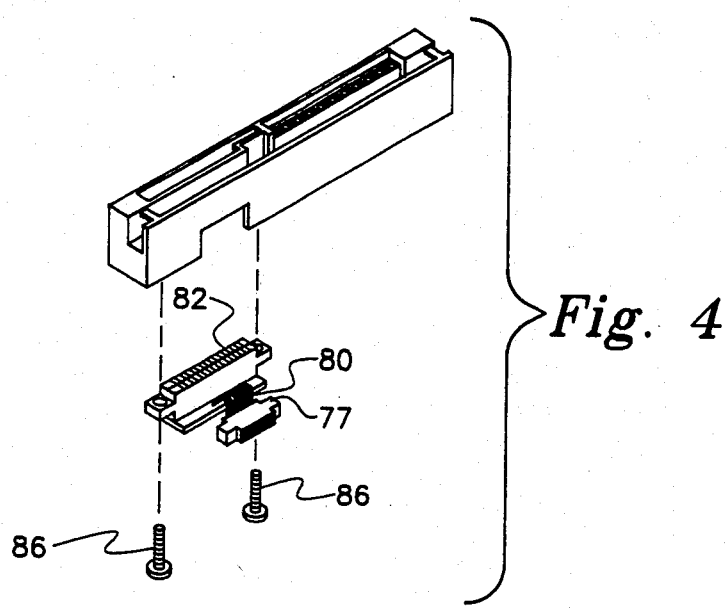
FIG. 4 is a partially exploded, perspective view of a backplane unit of in FIGS. 1 and 2.

Referring particularly now to FIG. 4, an data bus connecting the input/output modules to the programmable controller is formed by a bus segment in each backplane unit compromising an edge connector 77 and printed circuit board with edge contacts 78 both secured in the unit. When two backplane units are joined together by pins 62, the printed circuit board contacts 78 extending out from one side of one backplane module fit into the connector 77 mounted on the other side of the backplane housing to which it is joined. A flexible connector 80 connects the contacts of edge connector 77 to the printed circuit edge contact 78.

Another printed circuit board edge connector 82, oriented at right angles to the edge connector 77 provides an electrical connection between an input/output module 14 and the bus. Screws 86 secure this edge connector 82 to the housing adjacent terminals 28, with the upper surface of the edge connector below the seating surface. The backplane contacts of this edge connector are electrically connected to the appropriate conductors on the printed circuit board connected to 78.

Figure 5:
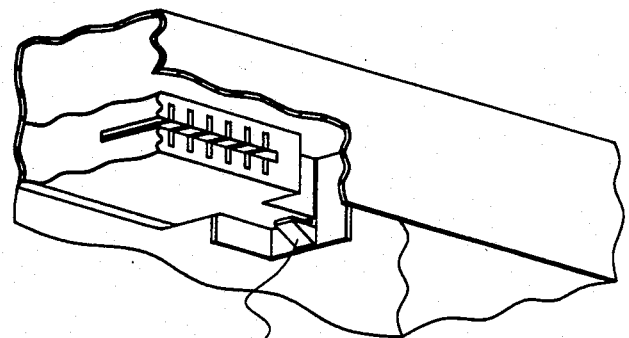
FIG. 5 is a fragmentary, perspective view, with parts broken away, showing how edge connector which forms part of a data bus is supported in a backplane unit.

It should be noted that while the edge connector 82 and printed circuit board are rigidly secured to the backplane unit by screws 86, a pair of clips 88 (shown in FIG. 5) secures the edge connector 77 to the backplane to allow limited movement of this connector so that it can align itself with edge contacts 78 extending from an adjacent unit.

In operation, an additional backplane unit may be attached to the programmable controller by inserting the pins 62 of the unit into the tube in adjacent, already in place unit. Field wiring may be connected to the terminals in the unit.

A programmable controller module is inserted into the backplane unit so that contacts which extend from the module, engage edge connector 82; and other contacts which extend from the module fit into clips 42 which are part of terminals 28. It will be noted that the field wire may be connected to the terminals prior to the insertion of the input/output module so that the input/output module may be inserted and/or removed without disturbing the field wire.

Those skilled in the art will recognize that only the preferred embodiment of the present invention is disclosed herein and that the embodiment may be altered and modified without departing from the true spirit and scope of the invention as defined in the accompanying claims.

What is claimed is:

1. In an expansible backplane for supporting and electrically interconnecting input/output modules in a programmable controller, a plurality of substantially identical first backplane units each comprising:
    a first housing having first and second side walls and a seating surface transverse to the side walls against which an input/output module may be secured;
    means associated with said first housing to guide and position said input/output module as it is being secured against the seating surface;
    field wiring connection means supported by said first housing intermediate said side walls and accessible from the seating surface, said field wiring connection means having a first pluggable connector portion adapted to mate with a first connector portion on said module; and
    a first data bus segment extending between the side walls of said first housing, said first data bus segment terminating in second and third complementary pluggable connector portions in the first and second side walls respectively, the second and third connector portions being located so that when first backplane units are assembled side by side a connector portion in the first side wall of one first backplane unit mates with the connector portion in the second side wall of an adjacent first backplane unit to form a continuous data bus through the assembled backplane, each data bus segment having a fourth connector portion intermediate the walls of said first housing and accessible from the seating surface thereon, the fourth connector portion being adapted to mate with a second connector portion on said module.

2. A backplane as defined in claim 1 wherein each backplane unit is formed with a trough beneath said seating surface with at least a portion of the trough adjacent said field wiring connection means for facilitating the routing of external field wiring thereto.

3. A backplane as defined in claim 1 wherein the data bus segment in each first backplane unit comprises:
    a printed circuit board mounted in said first housing substantially parallel with the seating surface thereon, said circuit board having a plurality of electrical contacts on an edge thereof which extends through the first side wall of said first housing to form the second connector portion of said first backplane unit;
    a first card edge connector mounted in the second wall of said first housing to form the third connector portion of said first backplane unit;
    a flexible cable connecting the contacts on said printed circuit board to said first card edge connector; and
    a second card edge connector mounted on said printed circuit board and having contacts therein electrically connected to the contacts on said printed circuit board, said second card edge connector forming the fourth connector portion of said first backplane unit, the fourth connector portion being adapted to mate with a card edge extending from and forming the second connector portion on said input/output module.

4. A backplane as defined in claim 3 wherein said first card edge connector is secured to said first housing by means of clips which allow limited movement of said first card edge connector with respect to said first housing.

5. A backplane as defined in claim 3 further including a central processor backplane unit comprising:
    a second housing having first and second side walls and a seating surface transverse to the side walls against which a central processor module may be secured;
    means associated with said second housing to guide and position said central processor module as it is being secured against the seating surface; and
    a second data bus segment terminating in fifth and sixth pluggable connector portions, the fifth connector portion being in the second side wall and the sixth connector portion being intermediate the walls of said second housing and accessible from the seating surface on said second housing, the fifth connector portion being located so that when first and second backplane units are assembled side by side, the connector portion in the first wall of a first backplane unit mates with the connector portion in the second wall of the central processor backplane unit.

6. A backplane as defined in claim 5 wherein each housing is provided with at least one circumferentially grooved pin extending from one of the first and second side walls, a corresponding mating aperture in the other of the first and second side walls and a slideable collar which may be positioned in the groove of a pin from an adjacent backplane unit in an assembled backplane to lock the backplane units together.

7. A backplane as defined in claim 6 further including a mounting bracket attached to the first side wall of the housing for the central processor backplane unit and a mounting bracket attached to the second side wall of the first backplane unit which is most remote from the central processor backplane unit in an assembled backplane.

8. A modular programmable controller comprising:
    a first backplane unit having first and third opposing surfaces and a second surface transverse to and between the first and third surfaces, said first backplane unit being adapted for mounting on a supporting structure with the first surface adjacent the supporting structure, said first backplane unit containing a data bus segment terminates at one end in a first connector portion accessible through the second surface and at the other end in a second connector portion accessible through the third surface;
    a central processing module adapted to be removably mounted on the third surface of said first backplane unit, said central processing module having a connector portion thereon which is adapted to mate with the second connector portion of said first backplane unit when said central processing module is mounted thereon;

a plurality of second backplane units, each having first and third opposing surfaces and second and fourth opposing surfaces transverse to and between the first and third surfaces;

a data bus segment in each of said plurality of second backplane units, the data bus segment in each second backplane unit comprising a printed circuit board mounted substantially parallel with the first surface on said second backplane unit, said circuit board having a plurality of electrical contacts on an edge thereof which extends through the second surface of said second backplane unit to form a first connector portion of the data bus segment, each data bus segment in a second backplane unit further comprising a first card edge connector mounted to be accessible through the fourth surface of said second backplane unit to form a second connector portion of the data bus segment, a flexible cable connecting the contacts on said printed circuit board to said first card edge connector, and a second card edge connector electrically connected to the contacts on said printed circuit board, said second card edge connector forming a third connecting portion of the data bus segment in said second backplane unit intermediate the second and fourth surfaces thereof and accessible from the third surface thereof, the first and second connector portions of the data bus segment being located so that when backplane units are assembled side by side the first connector portion of the data bus segment in one backplane unit mates with the second connector portion of the data bus segment in an adjacent backplane unit to form a continuous data bus through the assembled backplane; and a plurality of input/output modules adapted to be removably mounted on the third surfaces of said second backplane units, each input/output module having a connector portion thereon which is adapted to mate with the third connector portion of the data bus segment in the second backplane unit on which it is mounted.

9. The modular programmable controller of claim 8 wherein the first card edge connector in each second backplane unit is secured to the remainder of said backplane unit by means of clips which permit limited movement between said card edge connector and said backplane unit.

10. An expansible backplane for a modular programmable controller including a central processing mlodule and a plurality of input/output modules adapted to communicate with the central processing module through a data bus, the input/output modules further being adapted to receive signals from and supply signals to external devices through field wiring, the backplane being formed of a plurality of interconnectable backplane units, one backplane unit for each controller module, each backplane unit for an input/output module comprising:

a housing having first and second side walls and a seating surface transverse to the side walls against which an input/output module may be secured;

first and second connector portions accessible from the seating surface adapted to mate with complementary connector portions of the associated input/output module when the module is secured against the seating surface;

a data bus segment extending between the side walls, said data bus segment terminating in third and fourth complementary pluggable connector portions in the first and second side walls respectively, the third and fourth connector portions being located so that when backplane units are assembled side by side a connector portion in the first side wall of one backplane unit mates with the connector portion in the second side wall of an adjacent backplane unit to form a continuous data bus through the assembled backplane, the data bus segment further being electrically connected to the first connector portion; and field wiring connection means mounted in said housing intermediate the first and second side walls thereof and electrically connected to said second connector portion for the connection of external field wiring.

11. The expansible backplane of claim 10 wherein the data bus segment in each backplane unit comprises:

a printed circuit board mounted in said housing substantially parallel with the seating surface thereon, said circuit board having a plurality of electrical contacts on an edge thereof which extends through the first side wall of said housing to form the third connector portion;

a first card edge connector mounted in the second side wall of said housing to form the fourth connector portion;

a flexible cable connecting the contacts on said printed circuit board to said first card edge connector; and a second card edge connector mounted on said printed circuit board and having contacts therein electrically connected to the contacts on said printed circuit board, said second card edge connector forming the first connector portion adapted to mate with a card edge connector extending from an input/output module.

12. The expansible backplane of claim 11 wherein the first card edge connector for each backplane unit for an input/output module is secured to the housing of the backplane unit by means of clips which permit limited movement between the card edge connector and the housing.

* * * * *